(12) United States Patent
Bowers

(10) Patent No.: US 9,822,903 B2
(45) Date of Patent: Nov. 21, 2017

(54) SMART VALVE

(71) Applicant: Rave N.P., Inc., Delray Beach, FL (US)

(72) Inventor: Charles W. Bowers, Livermore, CA (US)

(73) Assignee: Raven N.P., Inc., Delray Beach, FL (US)

(*) Notice: Subject to any disclaimer, the term of this patent is extended or adjusted under 35 U.S.C. 154(b) by 0 days.

(21) Appl. No.: 14/189,337

(22) Filed: Feb. 25, 2014

(65) Prior Publication Data

US 2014/0238512 A1    Aug. 28, 2014

Related U.S. Application Data

(60) Provisional application No. 61/768,674, filed on Feb. 25, 2013.

(51) Int. Cl.
  *F16K 37/00* (2006.01)
  *G01R 31/28* (2006.01)

(52) U.S. Cl.
  CPC ...... *F16K 37/0083* (2013.01); *F16K 37/0041* (2013.01); *G01R 31/28* (2013.01); *Y10T 137/8242* (2015.04)

(58) Field of Classification Search
  CPC .. F16K 37/0091; F16K 41/10; F16K 37/0041; F16K 37/0083; Y10T 137/8158;
  (Continued)

(56) References Cited

U.S. PATENT DOCUMENTS 4,901,751 A * 2/1990 Story .................. F16K 37/00
                                                 137/312
4,915,347 A * 4/1990 Iqbal .................. E03C 1/057
                                                 137/605

(Continued)

FOREIGN PATENT DOCUMENTS

DE       19723207 A1   12/1998
WO       01/75344 A1   10/2001
WO    2008/011554 A1    1/2008

OTHER PUBLICATIONS

Swagelok, HB Series, High-Pressure, Pneumatically Actuated Bellows—Seated Valves, Jun. 2007, by Swagelok Company, p. 1-4; accessed via internet archive on Mar. 21, 2017 web site http://web.archive.org/web/20080723064142/http://www.swagelok.com/downloads/webcatalogs/EN/MS-01-76.PDF.*

(Continued)

*Primary Examiner* — Matthew W Jellett
(74) *Attorney, Agent, or Firm* — Baker & Hostetler

(57) ABSTRACT

A valve assembly including an actuated valve and a sensor module is disclosed. The actuated valve includes a body defining a chamber, a first fluid port coupled to the chamber, and a second fluid port coupled to the chamber. The actuated valve further includes a movable stem disposed at least partially within the chamber, the movable stem having a closed position and an open position relative to the chamber, and an actuator coupled to the stem. The sensor module is attached to the actuated valve, and the sensor module includes a microcontroller, and at least one sensor coupled to the microcontroller, the at least one sensor providing a signal associated with a status of the actuated valve.

20 Claims, 4 Drawing Sheets

(58) Field of Classification Search
CPC ........ Y10T 137/1875; Y10T 137/8326; G01M 3/16; G01M 3/04; G01M 3/184; G08B 21/20
USPC ............ 137/552; 70/40, 40.5 R, 46; 340/605
See application file for complete search history.

(56) References Cited

U.S. PATENT DOCUMENTS

| | | | |
|---|---|---|---|
| 5,637,789 A | 6/1997 | Lawson | |
| 5,746,435 A * | 5/1998 | Arbuckle | F16K 37/0091 277/304 |
| 6,050,296 A * | 4/2000 | Hoffmann | F16K 41/10 137/552 |
| 6,382,226 B1 | 5/2002 | Larson | |
| 6,592,126 B2 * | 7/2003 | Davis | F16J 15/004 137/312 |
| 7,059,338 B1 * | 6/2006 | Kincaid | F16K 31/046 137/14 |
| 7,168,628 B2 * | 1/2007 | Sheeran | G05D 23/1393 137/551 |
| 7,692,553 B2 * | 4/2010 | Kubala | B23Q 11/103 285/121.1 |
| 8,413,615 B2 * | 4/2013 | Tsuge | F24D 19/1051 122/14.22 |
| 2003/0014161 A1 | 1/2003 | Orthlieb et al. | |
| 2004/0129906 A1 * | 7/2004 | Authelet | F16K 27/08 251/12 |
| 2012/0031494 A1 | 2/2012 | Lymberopoulos | |

OTHER PUBLICATIONS

Notification of Transmittal of the International Search Report and the Written Opinion of the International Searching Authority issued in International Application No. PCT/US14/17924 dated Jun. 3, 2014.

* cited by examiner

SMART VALVE

CROSS REFERENCE TO RELATED APPLICATION

This application claims the benefit of priority to U.S. Provisional Patent Application No. 61/768,674, filed on Feb. 25, 2013, entitled "Smart Valve," the entire disclosure of which is hereby incorporated by reference.

TECHNICAL FIELD

This patent disclosure relates generally to valves, and more particularly to valves that include sensors.

BACKGROUND

Valves are known for controlling a flow of a fluid therethrough. Valves may be operated manually, or actuated by electrical, pneumatic, or hydraulic means, and include at least two ports through which the fluid passes. Fluid enters the valve through a first port, and, when the valve is in the open position, exits the valve through a second port. Fluid does not flow through the valve when the valve is in the closed position. Valves that include more than two ports may redirect the fluid among multiple piping subsystems connected to the ports.

Generally, a valve includes a valve body with at least two ports, a multi-position valve member that controls the flow of fluid through the valve body, and a handle or an actuator that is attached to the valve member via a valve stem. In the open position, the valve member does not prevent fluid flow, while in the closed position, the valve member is received by a valve seat and prevents the fluid from flowing from one port to the other port. Because the valve stem is a moving component, packing material, seals, gaskets, or other similar materials or structures known in the art, typically seal the valve stem to prevent fluid from leaking out of the valve. In some actuated valves, a leak port may be coupled to a chamber that houses the valve actuator to detect when fluid has undesirably migrated from the chamber that houses the valve member, along the valve stem and into the chamber that houses the actuator. The leak port can detect other types of valve failures, and may be coupled to other valve chambers as well.

Helium may be used to detect valve leaks by charging the piping system with helium, actuating the valve and checking the leak port with a helium leak detector. In certain applications, however, helium leak testing may not be practical. For example, a piping system that includes a cryogenic gas as the working fluid, such as $CO_2$, may be located within an isolated and sealed environment that is maintained at a very low dew point. In such a system, the valve leak port may not be accessible, charging the piping system with helium may not be convenient, and even visual inspection of the valve during normal operation may not be possible, since leaking $CO_2$ would not cause frost to form on the valve near the leak port due to the very low dew point of the environment.

An improved mechanism to detect valve leaks and failures in certain applications is desired.

SUMMARY

According to an aspect of the disclosure, a valve assembly comprises an actuated valve and a sensor module. The actuated valve includes a body defining a chamber, a first fluid port coupled to the chamber, and a second fluid port coupled to the chamber. The actuated valve further includes a movable stem disposed at least partially within the chamber, the movable stem having a closed position and an open position relative to the chamber, the closed position preventing fluid flow between the first port and the second port, and the open position allowing fluid flow between the first port and the second port, and an actuator coupled to the stem. The sensor module is attached to the actuated valve, and the sensor module includes a microcontroller, and at least one sensor coupled to the microcontroller, the at least one sensor providing a signal associated with a status of the actuated valve.

DETAILED DESCRIPTION

Figure 2:
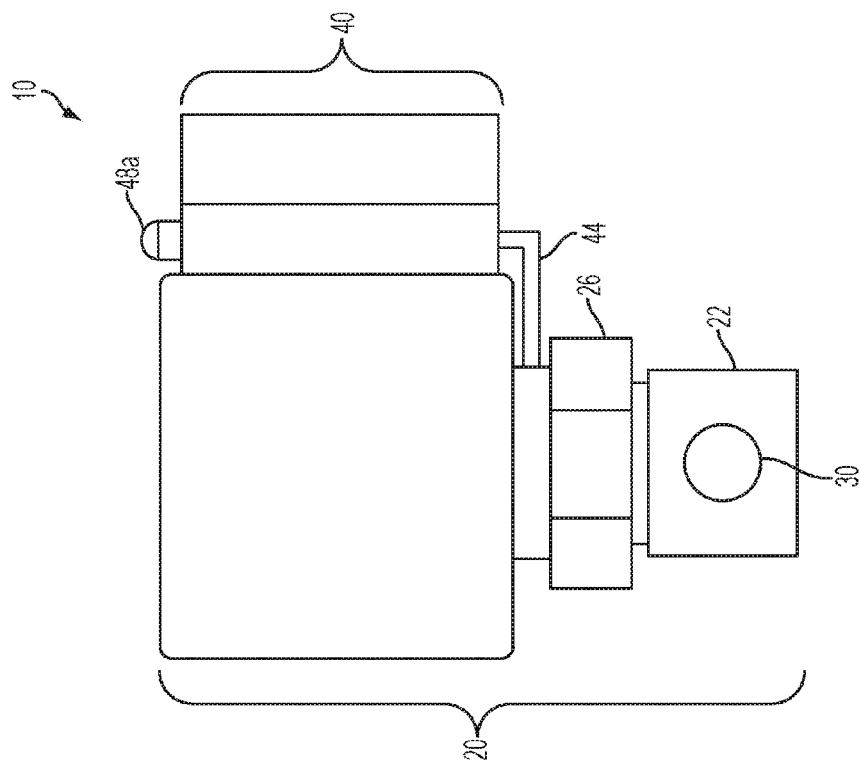
FIG. 2 is a side view of a smart valve, in accordance with an aspect of the disclosure.

Aspects of the disclosure will now be described with reference to the drawing figures, in which like reference numerals refer to like parts throughout, unless otherwise specified.

Aspects of the disclosure may advantageously provide detection of valve leaks and failures in isolated and hazardous environments. Valve leaks and failures in ultra-clean systems may cause adverse particle contamination, and leak detection may reduce troubleshooting time, expedite repair, reduce the risk of scrapping product due to valve malfunction, protect particle-sensitive components against gross contamination, and provide other advantages. Local and remote alerting capabilities may prevent operators from running these systems in unsafe conditions.

Figure 1:
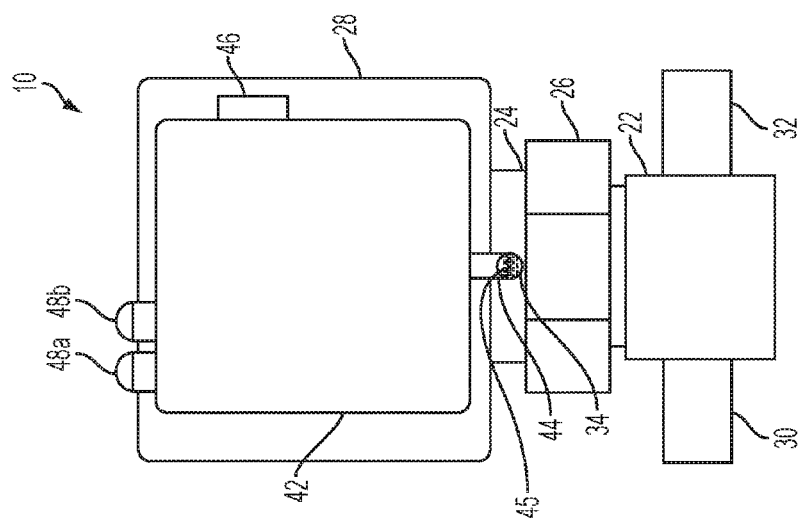
FIG. 1 is a front view of a smart valve, in accordance with an aspect of the disclosure.

FIG. 1 is a front view and FIG. 2 is a side view of a smart valve, in accordance with an aspect of the disclosure. Smart valve 10 generally includes an actuated valve 20 and a sensor module 40.

Actuated valve 20 may be an actuated bellows-sealed valve, an actuated diaphragm-sealed valve, an actuated ball valve, or other actuated valve known in the art. In one embodiment, actuated valve 20 is a high-pressure, pneumatically-actuated bellows-sealed valve, such as, for example, an HB series valve manufactured by Swagelok Company. Actuated valve 20 includes, inter alia, a body 22, a bonnet 24, a bonnet nut 26, a pneumatic actuator 28, a first port 30 and a second port 32. A bellows subassembly, including a valve stem, bellows and one or more stem seals, bushings, gaskets, etc., extends from a central chamber within body 22, into a central bore within bonnet 24, and into a central chamber within pneumatic actuator 28. The upper end of the valve stem is connected to a diaphragm within the pneumatic actuator 28, while the lower end includes a stem tip. Bonnet 24 includes a leak test port 34, which is coupled to the central bore within bonnet 24. In some valves, leak test port 34 may be located in body 22. The bellows and stem seal(s) provide fluidic isolation between the central chamber of body 22 and the central bore of bonnet 24. Accordingly, the presence of working fluid within the central bore of bonnet 24, which is detectable at the leak check port, indicates that a leak or failure has occurred within actuated valve 20.

Sensor module 40 includes a housing 42, a sensor lead 44 coupled to a sensor, a network interface port 46, and one or more LEDs 48a,b. In other embodiments, multiple sensor leads 44 are provided, each coupled connected to a respective sensor.

Figure 3:
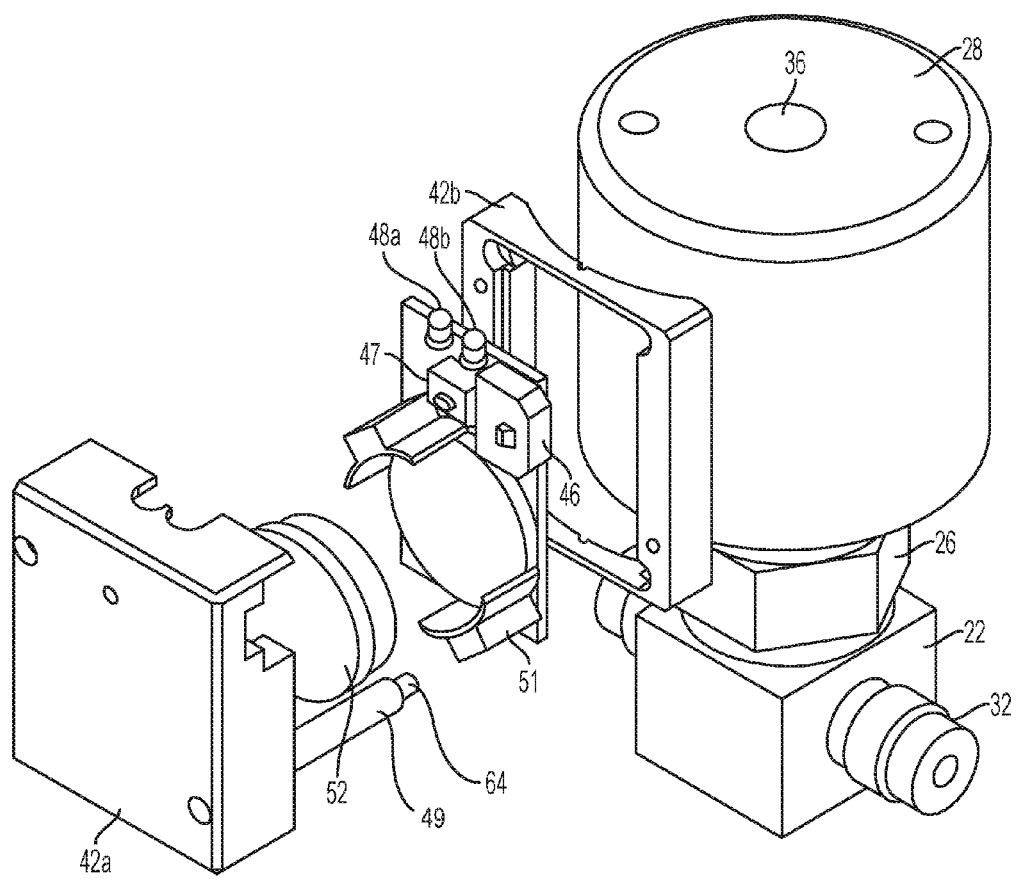
FIG. 3 is a partially-expanded perspective view of a smart valve, in accordance with an aspect of the disclosure.

FIG. 3 is a partially-expanded perspective view of a smart valve, in accordance with an aspect of the disclosure.

Sensor module 40 also includes a circuit board 50 upon which various electronic components and supporting analog and/or digital circuits are disposed, including, for example, signal processing and control, communications, power conditioning, etc. In one embodiment, circuit board 50 includes a battery housing 51 for battery 52, such as, for example, a coin-type battery. An external power port (not shown) may also be included, in addition to, or in place of, the battery 52. Power may also be provided through network interface port 46. In one embodiment, sensor module housing 42 may include a lower housing 42b fixedly or removably attachable to pneumatic actuator 28, and an upper housing 42a that includes various openings for LEDs 48a,b, network interface port 46, reset switch 47, etc.

Actuated valve 20 may include a pneumatic input port 36 and at least one vent passage (not shown).

Figure 4:
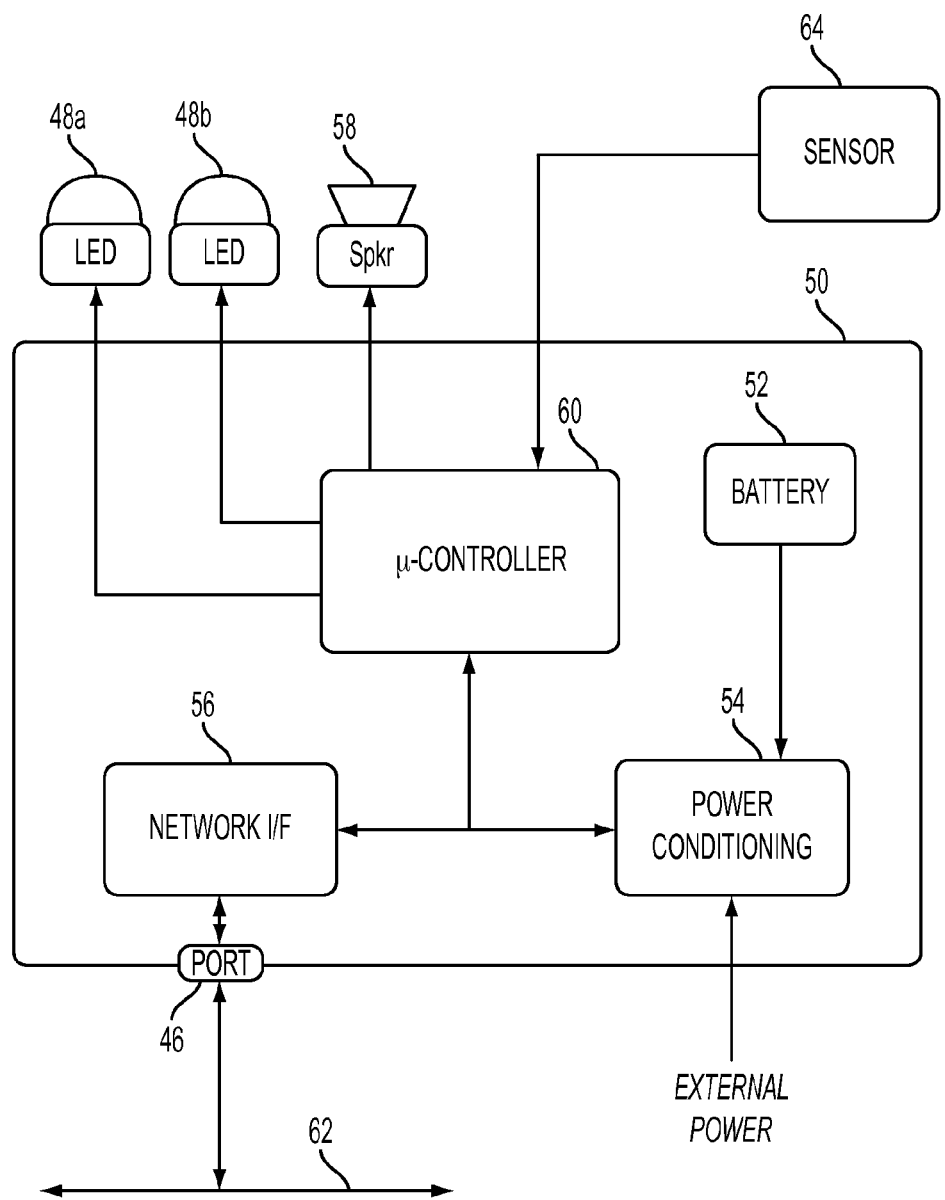
FIG. 4 is a schematic of a smart valve electronics module, in accordance with an aspect of the disclosure.

FIG. 4 is a schematic of a smart valve electronics module, in accordance with an aspect of the disclosure.

In one embodiment, circuit board 50 supports, inter alia, a microcontroller 60, such as, for example, a Silicon Labs C8051F996 microcontroller, which is coupled to network interface circuitry 56, power conditioning circuitry 54, LEDs 48a,b, audio speaker 58, and sensor 64. Microcontroller 60 generally acquires and processes data from sensor 64, manages power consumption and sleep cycles, manages communications over network interface circuitry 56, drives LEDs 48a,b and audio speaker 58, etc.

Network interface circuitry 56 includes one or more chipsets, transceivers, etc. to send and receive data over network 62. In one embodiment, network 62 is a local area network (LAN) using the Ethernet standard (IEEE 802.3) over Cat5 cable, and network interface circuitry 56 includes a single-chip Ethernet controller, such as, for example, the Silicon Labs CP2202 Ethernet controller. In another embodiment, network 62 is a wireless local area network (WLAN) using the Wi-Fi standard (IEEE 802.11), and network interface circuitry 56 includes a single-chip Wi-Fi controller, such as, for example, Texas Instruments CC3000. Other network topologies and protocols are also contemplated, such as Bluetooth, wireless USB, etc., as well as other communications connections, such as Universal Serial Bus (USB), Infra-red (IR), etc.

Power conditioning circuitry 54 provides power from battery 52, or an external power source, to the other electrical components disposed on circuit board 50. Microcontroller 60 may be programmed to adapt to the particular power source that is available. For example, microcontroller 60 may be programmed to sample and process sensor data at a slower rate, transmit data over network 62 less frequently, sleep for longer periods of time, etc., if external power is not available and only battery power is present.

Sensor 64 generally detects when the integrity of actuated valve 20 has been compromised. In one embodiment, sensor 64 is a temperature sensor that is located proximate to leak test port 34. A metal tube 49 may be installed over the leak test port 34, and the temperature sensor may be inserted into the tube. The temperature sensor may be a passive device, such as a thermistor 10k NTC, or an active electronic device, such as a temperature sensor LM335. For a cryogenic fluid, a sharp drop in temperature may indicate a leak 45 or other internal damage to actuated valve 20. Other types of sensors are also contemplated by aspects of the disclosure, such as, for example, pressure sensors, chemical sensors, optical sensors, MEWS or other acoustic microphones, etc. These sensors may detect other anomalous conditions, including adverse pressure changes, the presence of certain chemicals or gases, the expulsion of spray or liquid from the leak test port, atypical vibrations, etc. Sensor module 40 includes at least one sensor, and various redundant or non-redundant combinations of sensors are also contemplated by the aspects of the disclosure.

LEDs 48a,b and audio speaker 58 may be actuated by microcontroller 60 to indicate proper or improper operation of sensor module 40, failure states of actuated valve 20, communication link status, etc.

Figure 5:
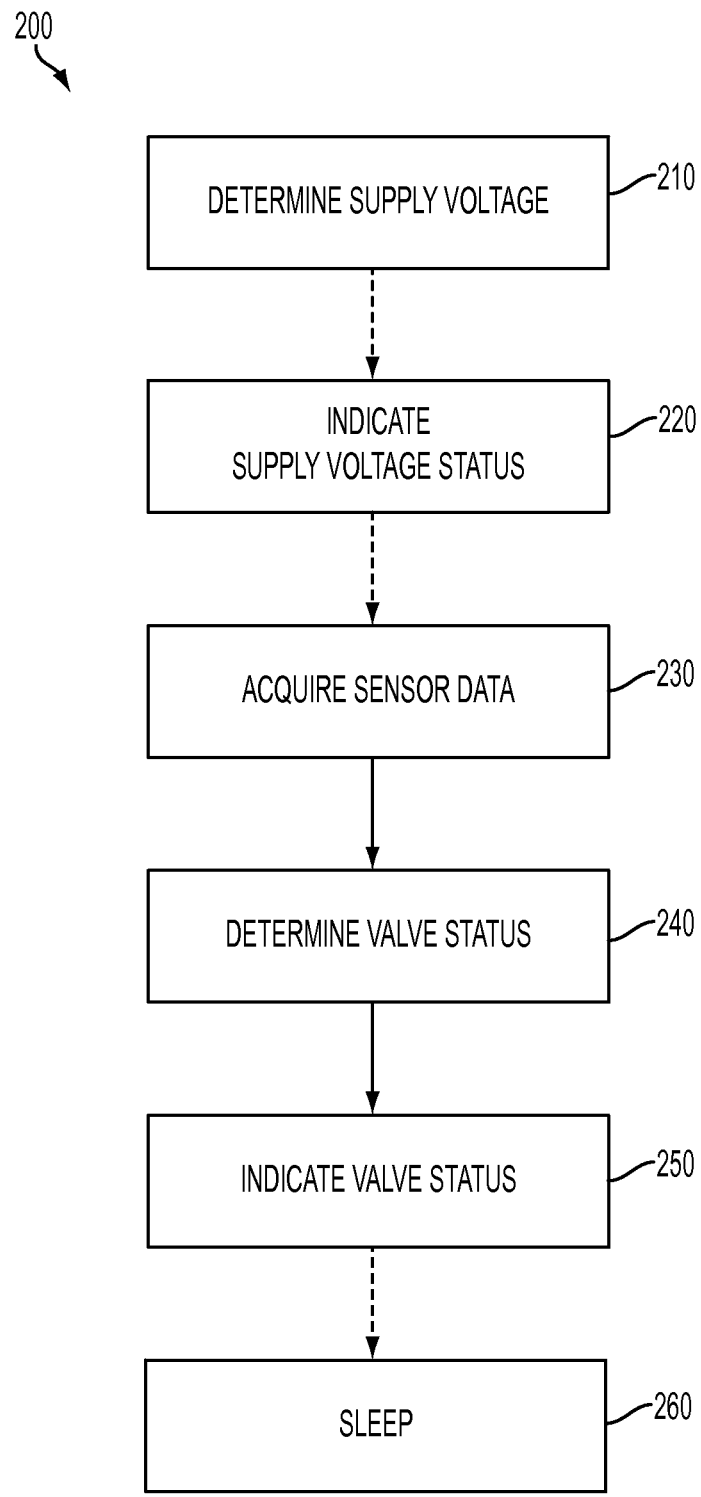
FIG. 5 is a flow chart of a method for detecting valve failures, in accordance with an aspect of the disclosure.

FIG. 5 is a flow chart for a method for detecting valve failures, in accordance with an aspect of the disclosure.

As discussed above, microcontroller 60 may be programmed to execute various functions, such as, for example, acquire and process data from sensor 64, manage power consumption and sleep cycles, manage communications over network interface 56, drive LEDs 48a,b and audio speaker 58, etc.

Method 200 outlines a computer-based method for detecting valve failures, according to an aspect of the disclosure. In one embodiment, at least some of the steps of method 200 are executed by microcontroller 60 in a continuous loop.

A supply voltage status is determined in step 210. Microcontroller 60 measures the supply voltage provided by the power conditioning circuitry 54, and determines whether the voltage level is within an acceptable limit for battery power only, external power only or a combination of both sources.

The supply voltage status is indicated in step 220. In one embodiment, microcontroller 60 flashes green LED 48a one or more times to indicate that the supply voltage status is within an acceptable limit, and flashes both green LED 48a and red LED 48b one or more times, simultaneously, alternatively, synchronously, asynchronously, etc. to indicate that the supply voltage status is not within the acceptable limit. In another embodiment, the supply voltage status may be communicated over network 62 to a remote computer, server, etc., and in a further embodiment, the supply voltage status may be indicated audibly by audio speaker 58. Combinations of these, and other methods, are also contemplated.

Steps 210 and 220 may be optional in certain embodiments, or, alternatively, performed infrequently.

Sensor data is acquired in step 230. For analog sensors, microcontroller 60 samples the analog sensor data signal provided over sensor lead 44, and may create a digital representation of the analog signal. For digital sensors, analog-to-digital conversion may not be required, and the digital sensor data signal may be provided to microcontroller 60 over sensor lead 44. After acquisition, the measured sensor data may be calibrated and then stored, at least temporarily, within an internal memory of microcontroller 60, or within volatile or non-volatile memory coupled thereto. Microcontroller 60 may also process the measured sensor data to determine various statistical parameters, such as, for example, average, mean, median, maximum, minimum, etc., according to known techniques.

A valve status is determined in step 240. Generally, microcontroller 60 compares the measured sensor data to a predetermined value, range, rate of change, trend, etc., and then sets the valve status to acceptable or unacceptable based on the comparison.

For those embodiments in which the working fluid is $CO_2$, microcontroller 60 may compare the measured temperature data provided by a temperature sensor, such as a thermistor, to a predetermined temperature value, temperature range, temperature rate of change, etc. For example, the measured temperature data may be compared to a temperature value, such as 20° C., and if the measured temperature data are below 20° C., then microcontroller 60 sets the valve status to unacceptable. For another example, the measured temperature data may be compared to a temperature range, such as 10° C. to 30° C., and if the measured temperature data are not within this temperature range, then microcontroller 60 sets the valve status to unacceptable. For another example, the measured temperature data may be compared to a variable temperature value, such as the ambient air temperature, and if the measured temperature data are below the ambient air temperature, then microcontroller 60 sets the valve status to unacceptable. For another example, the measured temperature data may be compared to a temperature threshold below a variable temperature value, such as 10° C. below the ambient temperature, and if the measured temperature data are below this temperature threshold, then microcontroller 60 sets the valve status to unacceptable. For another example, the measured temperature data may be acquired over time and stored to memory, and if the measured temperature data have dropped by more than 60° C. to 100° C. (e.g., 80° C.) over a predetermined time period, such as 10 seconds, 20 seconds, one minute, two minutes, five minutes, 10 minutes, etc., then microcontroller 60 sets the valve status to unacceptable.

For other embodiments, sensor 64 may include a plurality of sensors, such as a pressure sensor, a chemical sensor, an optical sensor, an acoustic sensor, etc., and microcontroller 60 compares the measured sensor data to a predetermined value, range, rate of change, trend, etc., and then sets the valve status to acceptable or unacceptable based on the comparison.

The valve status is indicated in step 250. In one embodiment, microcontroller 60 flashes red LED 48b one or more times, e.g., three times, to indicate that the valve status is unacceptable. In another embodiment, the valve status may be communicated over network 62 to a remote computer, server, etc., and in a further embodiment, the valve status may be indicated audibly by audio speaker 58. Combinations of these, and other methods, are also contemplated.

The microcontroller 60 may optionally sleep for a period of time in step 260. For example, if microcontroller 60 determines that external power is available, then the sleep period may be one second, two seconds, five seconds, etc., and, conversely, if microcontroller 60 determines that only battery power is available, then the sleep period may be five seconds, ten seconds, etc. Sleep periods may be chosen to compliment sensor processing and analysis times.

Aspects of the disclosure may advantageously provide a valve assembly including an actuated valve and a sensor module. The actuated valve includes a body with a chamber, a first fluid port coupled to the chamber and a second fluid port coupled to the chamber, a movable stem disposed at least partially within the chamber, and an actuator coupled to the stem. The stem has closed and open positions; the closed position prevents fluid flow between the first and second ports, while the open position allows fluid flow between the first and second ports. The sensor module is attached to the actuated valve, and includes a microcontroller and at least one sensor, coupled to the microcontroller, to provide data associated with a status of the actuated valve.

According to an aspect of the disclosure, the sensor is a temperature sensor, a pressure sensor, a chemical sensor, an optical sensor, or an acoustic sensor. In an embodiment, the sensor module includes at least two different sensors. In an embodiment, the actuated valve includes a leak test port, and the sensor is a thermistor disposed at a location proximate to the leak test port. In an embodiment, the sensor module includes at least one light emitting diode (LED). In an embodiment, the sensor module includes a green LED and a red LED. In an embodiment, the sensor module is coupled to a network. In an embodiment, the sensor module includes a battery.

According to an aspect of the disclosure, the microcontroller is adapted to execute instructions to detect a valve failure, including acquiring sensor data, determining a valve status, and indicating the valve status. In an embodiment, acquiring sensor data includes sampling an analog sensor data signal, creating digital sensor data from the analog sensor data signal, and optionally calibrating the digital sensor data. In an embodiment, determining the valve status includes comparing the digital sensor data to a predetermined value, and setting a valve status to acceptable or unacceptable based on the comparison. In an embodiment, determining the valve status includes determining a change in the digital sensor data over a predetermined time period, comparing the change in the digital sensor data to a predetermined value, and setting a valve status to unacceptable if the change is greater than the predetermined value.

According to an aspect of the disclosure, the actuated valve includes a leak test port, the sensor is a thermistor disposed at a location proximate to the leak test port, the predetermined time is between 10 seconds and 5 minutes, and the predetermined value is between 60° C. and 100° C. In an embodiment, the predetermined time is about 1 minute and the predetermined temperature is about 80° C. In an embodiment, the sensor module includes a red LED, and indicating the valve status includes flashing the red LED three times if the valve status is unacceptable. In an embodiment, the sensor module includes an audio speaker, and indicating the valve status includes emitting an audible alarm from the audio speaker if the valve status is unacceptable. In an embodiment, the sensor module is coupled to a network, and indicating the valve status includes sending a message to a remote computer over the network if the valve status is unacceptable. In an embodiment, the instructions include determining a supply voltage status, and indicating the supply voltage status. In an embodiment, determining a supply voltage status includes measuring the supply voltage level, comparing the measured supply voltage level with a voltage threshold, and determining whether the supply voltage status is acceptable or unacceptable based on the comparison. In an embodiment, the sensor module includes a green LED and a red LED, and indicating the supply voltage status includes flashing the green LED once if the supply voltage status is acceptable, and flashing the green LED and the red LED once if the supply voltage status is unacceptable.

It will be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

What is claimed is:

1. A valve assembly, comprising: a pneumatically actuated valve, including:
   a body defining a chamber, a first fluid port coupled to the chamber, and a second fluid port coupled to the chamber;
   a pneumatic actuator configured to operate the pneumatically actuated valve to be in an open position and to be in a closed portion relative to the chamber, the closed position preventing $CO_2$ working fluid flow between the first fluid port and the second fluid port, and the open position allowing the $CO_2$ working fluid flow between the first fluid port and the second fluid port;
   a bonnet interposed between the body and the pneumatic actuator, the bonnet including a leak test port; and
   a sensor module attached to the pneumatic actuator, the sensor module including:
   a microcontroller, and
   at least one sensor coupled to the microcontroller, the at least one sensor configured to provide a signal associated with a status of the pneumatically actuated valve based on a detected temperature of the $CO_2$ working fluid wherein the at least one sensor is located proximate to the leak test port and outside the bonnet,
   wherein the microcontroller is configured to detect a leak of the $CO_2$ working fluid into the pneumatic actuator of the pneumatically actuated valve based on a change of the temperature of the $CO_2$ working fluid detected by the least one sensor.

2. The valve assembly of claim 1, wherein the at least one sensor comprises a plurality of sensors that include a temperature sensor, a pressure sensor, and at least one of a chemical sensor, an optical sensor, and an acoustic sensor.

3. The valve assembly of claim 1, wherein the pneumatically actuated valve further comprises a metal tube installed over a leak test port, and the at least one sensor is a thermistor disposed within the metal tube at a location proximate to the leak test port.

4. The valve assembly of claim 1, wherein the sensor module includes at least one light emitting diode (LED).

5. The valve assembly of claim 4, wherein the at least one LED includes a green LED and a red LED.

6. The valve assembly of claim 1, wherein the sensor module is coupled to a network.

7. The valve assembly of claim 1, wherein the sensor module includes a battery.

8. The valve assembly of claim 1, wherein the microcontroller is further configured to:
   acquire a temperature of the $CO_2$ working fluid detected by the at least one sensor;
   determine a valve status based on the temperature of the $CO_2$ working fluid detected by the at least one sensor; and
   indicate the valve status based on the determination of the valve status, wherein the pneumatically actuated valve controls a flow of the $CO_2$ working fluid.

9. The valve assembly of claim 8, wherein the microcontroller is further configured to:
   sample an analog sensor data signal; and
   create digital sensor data from the analog sensor data signal.

10. The valve assembly of claim 9, wherein the microcontroller is further configured to:
    compare the digital sensor data to a predetermined value; and
    set a valve status indicator to acceptable or unacceptable based on the comparison.

11. The valve assembly of claim 9, wherein the microcontroller is further configured to:
    determine a change in the digital sensor data over a predetermined time period;
    compare the change in the digital sensor data to a predetermined value; and
    set the valve status indicator to unacceptable if the change in the digital sensor data is greater than the predetermined value.

12. The valve assembly of claim 11, wherein the actuated valve further comprises a leak test port arranged in a valve bonnet, wherein the at east one sensor is a thermistor disposed at a location proximate to the leak test port, wherein the predetermined time period is between about 10 seconds and about 5 minutes, and wherein the predetermined value is between about 60° C. and about 100° C.

13. The valve assembly of claim 12, wherein the predetermined time period is about 1 minute and the predetermined value is about 80° C.

14. The valve assembly of claim 8, wherein the sensor module includes a red LED, and wherein the microcontroller is further configured to flash the red LED three times if the valve status is unacceptable.

15. The valve assembly of claim 8, wherein the sensor module includes an audio speaker, and wherein the microcontroller is further configured to emit an audible alarm from the audio speaker if the valve status is unacceptable.

16. The valve assembly of claim 8, wherein the sensor module is coupled to a network, and wherein the microcontroller is further configured to send a message to a remote computer over the network if the valve status is unacceptable.

17. The valve assembly of claim 8, wherein the microcontroller is further configured to:
    determine a supply voltage status; and
    indicate the supply voltage status.

18. The valve assembly of claim 17, wherein the microcontroller is further configured to:
    measure a supply voltage level;
    compare the measured supply voltage level with a voltage threshold; and
    determine whether the supply voltage status is acceptable or unacceptable based on the comparison.

19. The valve assembly of claim 18, wherein the sensor module includes a green light emitting diode (LED) and a red LED, and wherein the microcontroller is further configured to:
    flash the green LED once in response to determining that the supply voltage status is acceptable; and flash the green LED and the red LED once in response to determining that the supply voltage status is unacceptable.

20. An ultra-clean system operating in a hazardous environment comprising the valve assembly of claim 1.

* * * * *